(12) United States Patent
Chihaya et al.

(10) Patent No.: US 12,170,217 B2
(45) Date of Patent: Dec. 17, 2024

(54) SUBSTRATE PROCESSING APPARATUS AND ABNORMALITY DETECTION METHOD

(71) Applicant: Tokyo Electron Limited, Tokyo (JP)

(72) Inventors: Hiroaki Chihaya, Nirasaki (JP); Yasuhiko Kojima, Nirasaki (JP); Einstein Noel Abarra, Fuchu (JP); Tetsuya Miyashita, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 241 days.

(21) Appl. No.: 17/652,545

(22) Filed: Feb. 25, 2022

(65) Prior Publication Data

US 2022/0285197 A1    Sep. 8, 2022

(30) Foreign Application Priority Data

Mar. 8, 2021  (JP) .................................. 2021-036648

(51) Int. Cl.
*H01L 21/683*    (2006.01)
(52) U.S. Cl.
CPC .................................. *H01L 21/6833* (2013.01)
(58) Field of Classification Search
CPC ........... H01L 21/6833; H01L 21/67236; H01L 21/6838; H01L 21/687; H01L 21/68771; H01L 21/68; H01L 21/6831
See application file for complete search history.

(56) References Cited

U.S. PATENT DOCUMENTS

| | | | |
|---|---|---|---|
| 11,114,326 B2 * | 9/2021 | Boyd, Jr. | H01J 37/32449 |
| 2019/0206712 A1 * | 7/2019 | Boyd, Jr. | H01J 37/32715 |
| 2022/0285197 A1 * | 9/2022 | Chihaya | H01L 21/67103 |
| 2023/0008922 A1 * | 1/2023 | Pemmasani | H01L 21/68792 |

FOREIGN PATENT DOCUMENTS

| | | |
|---|---|---|
| JP | 2005-116565 A | 4/2005 |
| JP | 2010-109350 A | 5/2010 |
| JP | 2013-168428 A | 8/2013 |
| JP | S611666 B2 | 11/2019 |
| KR | 10-2020-0072266 A | 6/2020 |

* cited by examiner

*Primary Examiner* — Lee D Wilson
(74) *Attorney, Agent, or Firm* — Armstrong Teasdale LLP

(57) ABSTRACT

A substrate processing apparatus includes: a stage including an electrostatic chuck configured to attract a substrate; a heater configured to heat the stage; a heating drive part configured to supply power to the heater so that a temperature of the stage becomes a target value; and a detector configured to detect an abnormality in attraction of the substrate by the electrostatic chuck, wherein the detector is further configured to detect the abnormality based on fluctuation of the power supplied to the heater, the fluctuation being generated by the attraction of the substrate by the electrostatic chuck.

3 Claims, 11 Drawing Sheets

Average power supplied to heater [%]

SUBSTRATE PROCESSING APPARATUS AND ABNORMALITY DETECTION METHOD

CROSS-REFERENCE TO RELATED APPLICATION

This application is based upon and claims the benefit of priority from Japanese Patent Application No. 2021-036648, filed on Mar. 8, 2021, the entire contents of which are incorporated herein by reference.

TECHNICAL FIELD

The present disclosure relates to a substrate processing apparatus and an abnormality detection method.

BACKGROUND

An electrostatic chuck is used to hold a substrate to be processed in a substrate processing apparatus that is used in a semiconductor manufacturing apparatus (Patent Document 1).

PRIOR ART DOCUMENT

Patent Document

Patent Document 1: Japanese Patent No. 6611666

When the electrostatic chuck does not attract the substrate to be processed with sufficient suction force, there is a possibility that a temperature of the substrate is not controlled normally.

SUMMARY

According to an aspect of the present disclosure, there is provided a substrate processing apparatus including: a stage including an electrostatic chuck configured to attract a substrate; a heater configured to heat the stage; a heating drive part configured to supply power to the heater so that a temperature of the stage becomes a target value; and a detector configured to detect an abnormality in attraction of the substrate by the electrostatic chuck, wherein the detector is further configured to detect the abnormality based on fluctuation of the power supplied to the heater, the fluctuation being generated by the attraction of the substrate by the electrostatic chuck.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
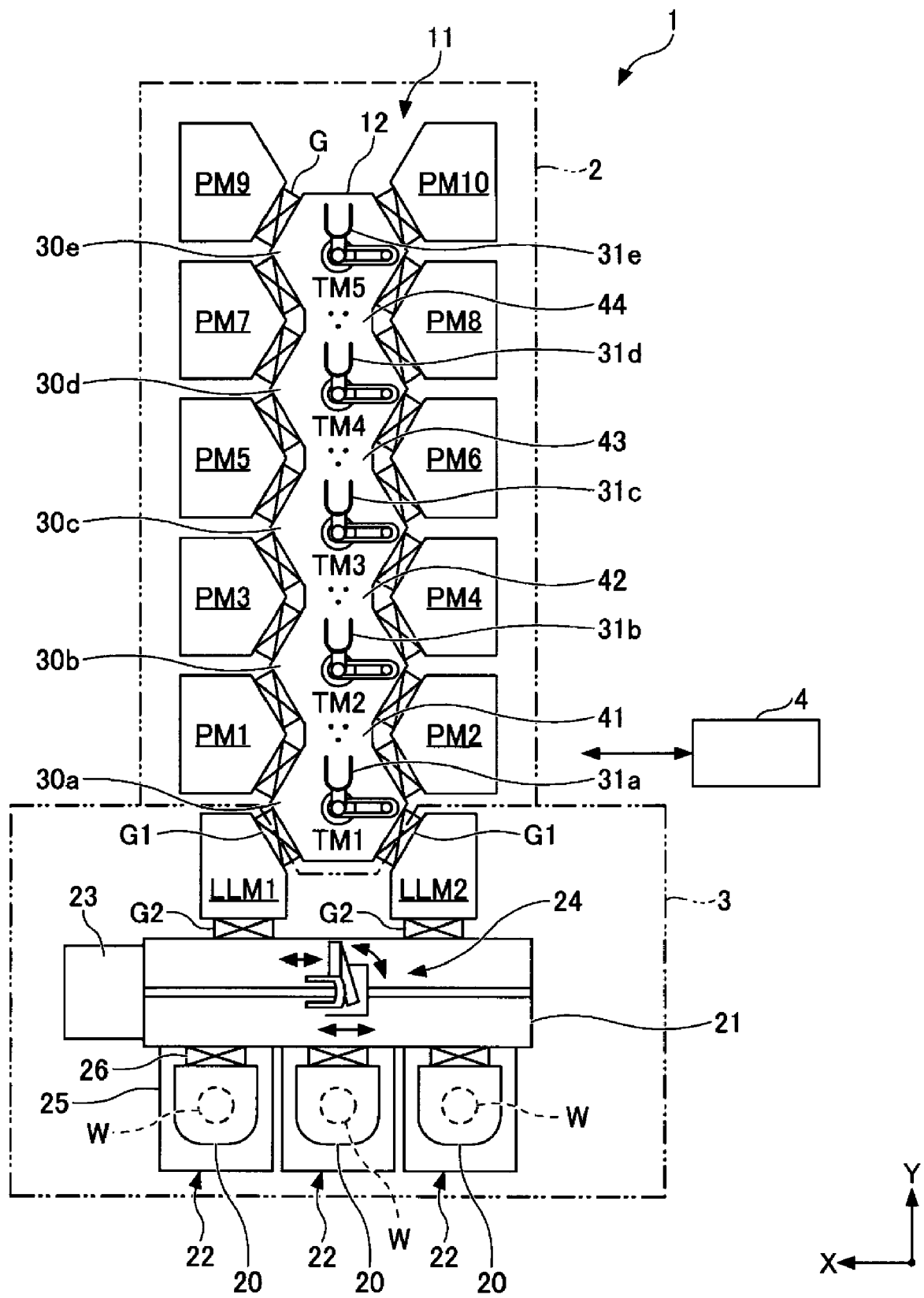
FIG. 1 is a schematic cross-sectional view of an example of a semiconductor manufacturing apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments for executing the present disclosure will be described with reference to drawings. In the specification and drawings, constituent elements that are substantially the same will be denoted by the same reference numerals, and redundant descriptions will be omitted. In order to facilitate understanding, each part illustrated in the drawings may be out of scale.

In directions of parallel, right angle, orthogonal, horizontal, vertical, up/down, left/right, and the like, deviations that do not impair an effect of an embodiment is allowed. A shape of a corner portion is not limited to a right angle, and may be rounded in a bow shape. The terms, parallel, right-angled, orthogonal, horizontal, and vertical, may include substantially parallel, substantially right-angled, substantially orthogonal, substantially horizontal, and substantially vertical.

First Embodiment

<Semiconductor Manufacturing Apparatus 1>

FIG. 1 is a schematic cross-sectional view of a semiconductor manufacturing apparatus 1 shown as an example of a semiconductor manufacturing apparatus according to the present embodiment. The semiconductor manufacturing apparatus 1 performs a plurality of processes (desired processes such as etching, film formation, and ashing) on a substrate W. The semiconductor manufacturing apparatus 1 includes a processing part 2, a loading/unloading part 3, and a controller 4. The substrate W is not particularly limited, but is, for example, a semiconductor wafer (hereinafter, simply referred to as a "wafer").

The loading/unloading part 3 loads and unloads a substrate, such as a wafer, with respect to the processing part 2. The processing part 2 includes a plurality of process modules PM1 to PM10 (ten process modules in this embodiment), each of which performs a desired vacuum process on a wafer. Wafers are serially transferred (sequentially transferred) by a first transfer device 11 to the plurality of process modules PM1 to PM10.

The first transfer device 11 includes a plurality of transfer modules TM1 to TM5. The transfer modules TM1 to TM5 include containers 30a, 30b, 30c, 30d, and 30e, respectively, each of which has a hexagonal shape in a plan view and is held in a vacuum. In addition, the transfer modules TM1 to TM5 include articulated transfer mechanisms 31a, 31b, 31c, 31d, and 31e, which are provided in the containers 30a, 30b, 30c, 30d, and 30e, respectively.

Delivery parts 41, 42, 43, and 44 as transfer buffers are provided between the transfer mechanisms 31a, 31b, 31c, 31d, and 31e of the transfer modules TM1 to TM5, respectively. The containers 30a, 30b, 30c, 30d, and 30e of the transfer modules TM1 to TM5 are in communication with one another to form a single transfer chamber 12.

The transfer chamber 12 extends in a Y direction in the drawings. Five process modules among the process modules PM1 to PM10 are connected to each side of the transfer chamber 12 via gate valves G that may open. The gate valves G of the process modules PM1 to PM10 are opened when the transfer modules TM1 to TM5 access the process modules PM1 to PM10, and are closed while a desired process is performed therein.

The loading/unloading part 3 is connected to one end side of the processing part 2. The loading/unloading part 3 includes an atmospheric transfer chamber 21, three load ports 22, an aligner module 23, two load-lock modules LLM1 and LLM2, and a second transfer device 24. The load ports 22, the aligner module 23, and the load-lock modules LLM1 and LLM2 are connected to the atmospheric transfer chamber 21. In addition, the second transfer device 24 is provided in the atmospheric transfer chamber 21.

The atmospheric transfer chamber 21 has a rectangular parallelepiped shape, a length direction in the X direction in the drawings. The three load ports 22 are provided on a long side wall of the atmospheric transfer chamber 21 on a side opposite to the processing part 2. Each of the load ports 22 has a stage 25 and a transfer port 26. On the stage 25, a front open unified pod (FOUP) 20, which is a substrate container for accommodating a plurality of wafers, is placed. The FOUP 20 on the stage 25 is connected to the atmospheric transfer chamber 21 via the transfer port 26 in a sealed state. The aligner module 23 is connected to one short side wall of the atmospheric transfer chamber 21. Wafer alignment is performed in the aligner module 23.

The two load-lock modules LLM1 and LLM2 are provided for wafer transfer between the atmospheric transfer chamber 21 having an atmospheric pressure and the transfer chamber 12 having a vacuum atmosphere, and pressures of the two load-lock modules LLM1 and LLM2 are variable between the atmospheric pressure and a vacuum that is substantially the same to that of the transfer chamber 12. Each of the two load-lock modules LLM1 and LLM2 has two transfer ports. One of the two transfer ports is connected to a long side wall of the atmospheric transfer chamber 21 on a side of the processing part 2 via a gate valve G2. The other of the two transfer ports is connected to the transfer chamber 12 of the processing part 2 via a gate valve G1.

The load-lock module LLM1 is used when a wafer is transferred from the loading/unloading part 3 to the processing part 2. The load-lock module LLM2 is used when the wafer is transferred from the processing part 2 to the loading/unloading part 3. The load-lock modules LLM1 and LLM2 may be configured to perform a process such as a degassing process.

The second transfer device 24 in the atmospheric transfer chamber 21 has an articulated structure, and performs wafer transfer with respect to the FOUPs 20 on the load ports 22, the aligner module 23, and the load-lock modules LLM1 and LLM2. Specifically, the second transfer device 24 takes out an unprocessed wafer from the FOUP 20 on the load port 22 and transfers the wafer to the aligner module 23, and then transfers the wafer from the aligner module 23 to the load-lock module LLM1. In addition, the second transfer device 24 receives a processed wafer transferred from the processing part 2 to the load-lock module LLM2, and transfers the wafer to the FOUP 20 on the load port 22. FIG. 1 illustrates an example in which the second transfer device 24 has one pick for receiving a wafer, but two picks may be provided.

A transfer part of the semiconductor manufacturing apparatus 1 is configured with the first transfer device 11 and the second transfer device 24 described above. In the processing part 2, the process modules PM1, PM3, PM5, PM7, and PM9 are arranged on one side of the transfer chamber 12 in this order from a side of the load-lock module LLM1. In addition, in the processing part 2, the process modules PM2, PM4, PM6, PM8, and PM10 are arranged on the other side of the transfer chamber 12 in this order from a side of the load-lock module LLM2. In the first transfer device 11, the transfer modules TM1, TM2, TM3, TM4, and TM5 are arranged in this order from the sides of the load-lock modules LLM1 and LLM2.

The transfer mechanism 31a of the transfer module TM1 is capable of accessing the load-lock modules LLM1 and LLM2, the process modules PM1 and PM2, and the delivery part 41. The transfer mechanism 31b of the transfer module TM2 is capable of accessing the process modules PM1, PM2, PM3, and PM4, and the delivery parts 41 and 42.

The transfer mechanism 31c of the transfer module TM3 is capable of accessing the process modules PM3, PM4, PM5, and PM6, and the delivery parts 42 and 43. The transfer mechanism 31d of the transfer module TM4 is capable of accessing the process modules PM5, PM6, PM7, and PM8, and the delivery parts 43 and 44. The transfer mechanism 31e of the transfer module TM5 is capable of accessing the process modules PM7, PM8, PM9, and PM10, and the delivery part 44.

Figure 2:
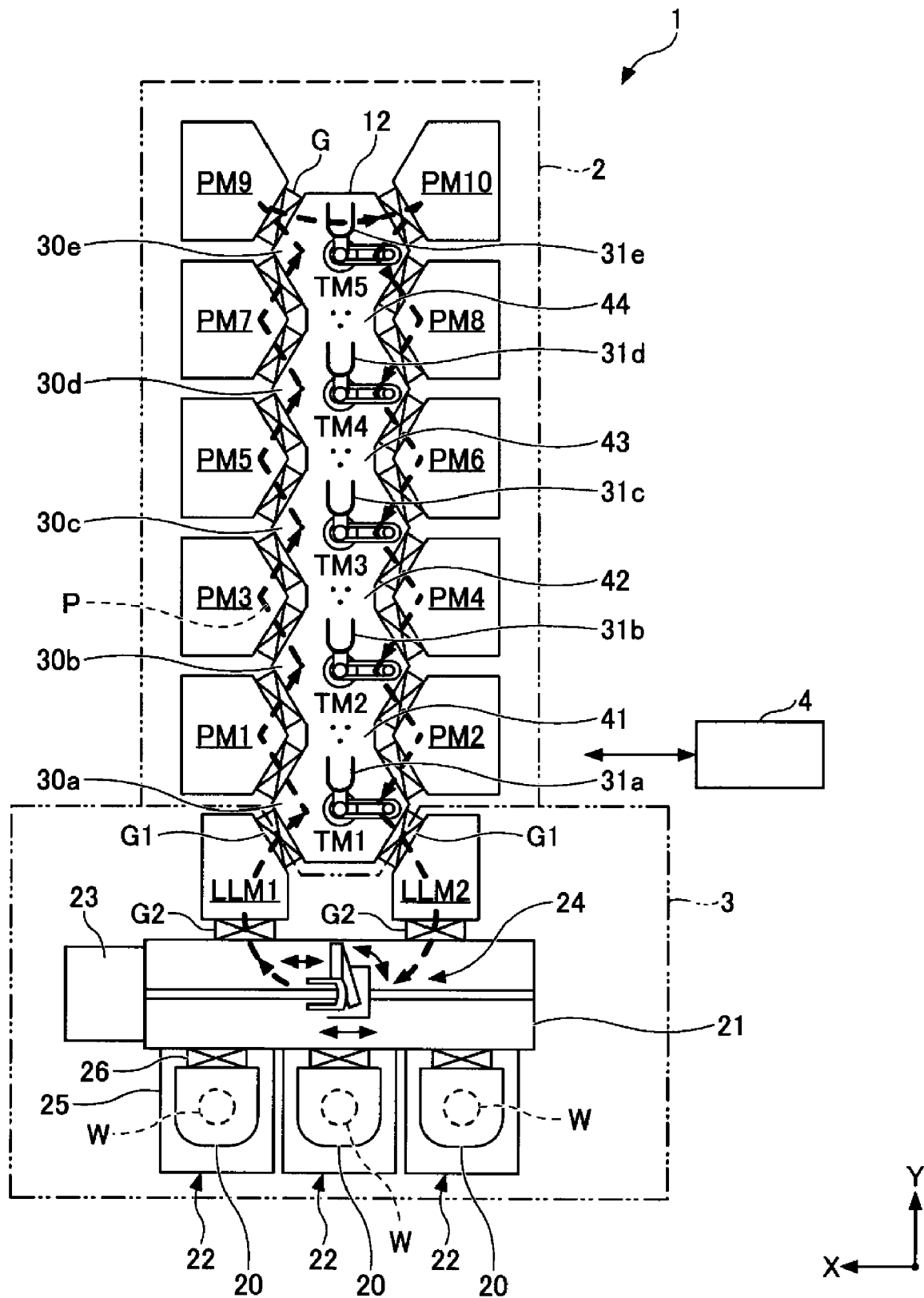
FIG. 2 is a schematic cross-sectional view of an example of a wafer transfer path of the semiconductor manufacturing apparatus according to the embodiment.

The transfer modules TM1 to TM5 of the second transfer device 24 and the first transfer device 11 are configured as illustrated in FIG. 1. Therefore, as illustrated in FIG. 2, wafers taken out from the FOUP 20 are serially transferred in one direction along a substantially U-shaped path P in the processing part 2, processed by the process modules PM1 to PM10, and returned to the FOUP 20. That is, the wafers are serially transferred in the order of process modules PM1, PM3, PM5, PM7, PM9, PM10, PM8, PM6, PM4, and PM2, and desired processes are performed.

The semiconductor manufacturing apparatus 1 may be used, for example, for manufacturing a laminated film (a magnetoresistive tunnel junction (MTJ) film) used for magnetoresistive random access memory (MRAM). Manufacturing the MTJ film includes a plurality of desired processes such as a pre-cleaning process, a film forming process, an oxidation process, a heating process, and a cooling process, and these desired processes are performed by the process modules PM1 to PM10, respectively. One or more of the process modules PM1 to PM10 may be standby modules that allow wafers to stand by therein.

The controller 4 controls respective components of the semiconductor manufacturing apparatus 1. The controller 4 controls, for example, the transfer modules TM1 to TM5 (the transfer mechanisms 31a to 31e), the second transfer device 24, the process modules PM1 to PM10, the load-lock modules LLM1 and LLM2, the transfer chamber 12, and the gate valves G, G1, and G2. The controller 4 is, for example, a computer.

<Substrate Processing Apparatus 5>

Figure 3:
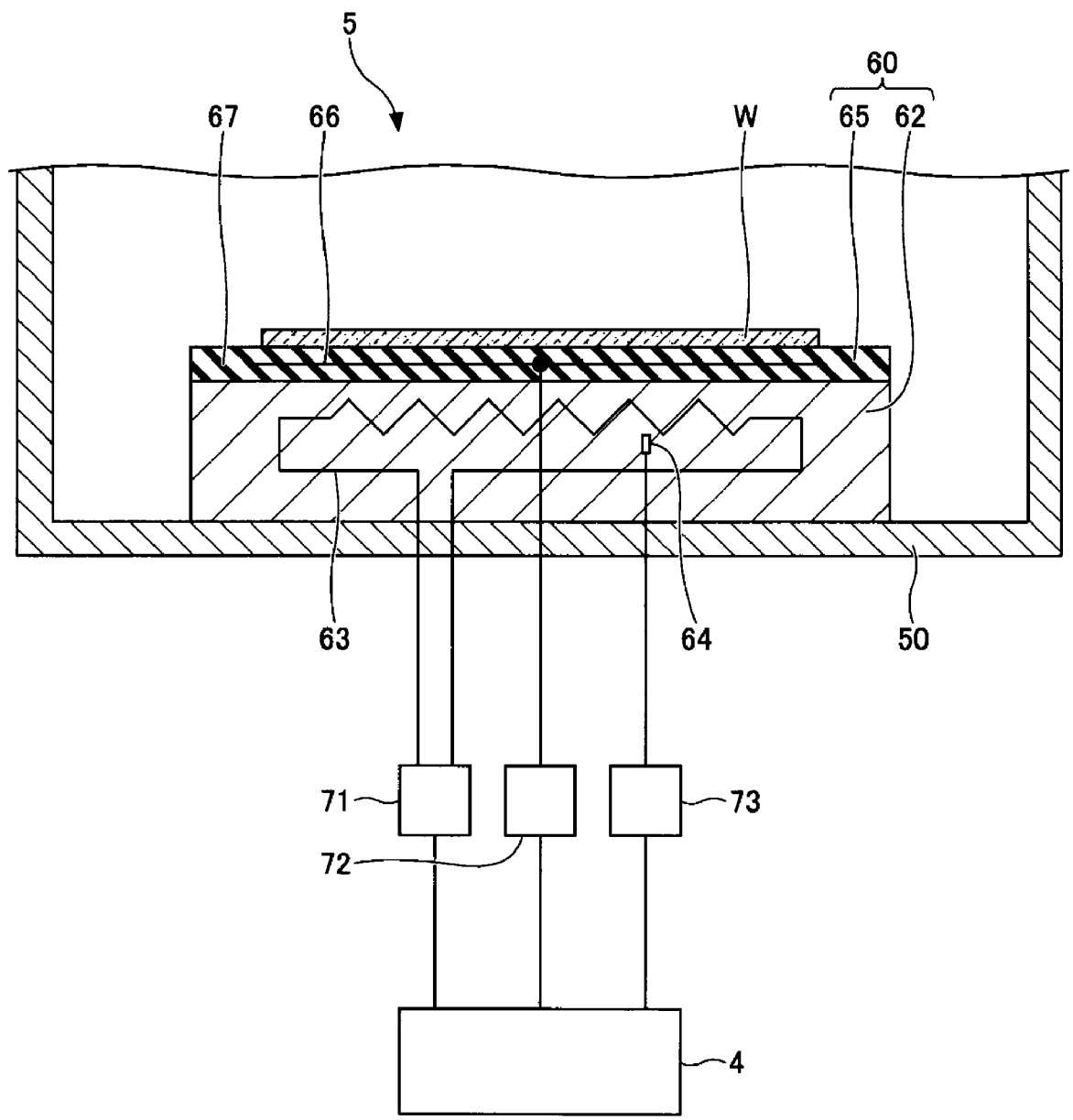
FIG. 3 is a schematic cross-sectional view of an example of a substrate processing apparatus of a semiconductor manufacturing apparatus according to a first embodiment.

Next, a substrate processing apparatus 5 used in any of the process modules PM1 to PM10 will be described. FIG. 3 is a schematic cross-sectional view of the substrate processing apparatus 5 which is an example of a substrate processing apparatus of the semiconductor manufacturing apparatus according to the present embodiment.

The substrate processing apparatus 5 includes a stage 60 on which a substrate W is placed inside the processing container 50. The stage 60 includes a base 62 and an electrostatic chuck 65.

The base 62 is formed of, for example, aluminum. The base 62 has a substantially disk-like shape.

The electrostatic chuck 65 is provided on a top surface of the base 62. The electrostatic chuck 65 holds the substrate W by electrostatic attraction. The electrostatic chuck 65 has an electrode 66 formed of a conductive film. The electrode 66 is sandwiched between dielectric films 67. A DC power supply 72 is connected to the electrode 66 of the electrostatic chuck 65. The electrostatic chuck 65 attracts and holds the substrate W on the electrostatic chuck 65 by electrostatic force generated by a voltage applied from the DC power supply 72.

The base 62 includes therein, for example, a heater 63 which is an electric heater. In addition, the base 62 includes therein a temperature sensor 64 that detects a temperature of the base 62. The temperature sensor 64 is, for example, a thermocouple or a temperature measurement resistor.

The heater 63 is connected to a heating drive part 71. The heating drive part 71 supplies power to the heater 63. The heater 63 supplied with power from the heating drive part 71 heats the base 62. By heating the base 62, the electrostatic chuck 65 is heated. By heating the electrostatic chuck 65, the substrate W attracted to the electrostatic chuck 65 is heated.

The temperature sensor 64 is connected to a temperature converter 73. The temperature converter 73 converts a signal from the temperature sensor 64 into a temperature signal and outputs the temperature signal to the controller 4.

The heating drive part 71 supplies power to the heater 63 to make the temperature of the stage 60 become a set target value. Specifically, the heating drive part 71 adjusts the power supplied to the heater 63 based on a control signal from the controller 4. The heating drive part 71 adjusts the power supplied to the heater 63 such that the temperature of the stage 60 becomes constant at the target value.

The controller 4 controls the heating drive part 71 according to the temperature signal output from the temperature converter 73. Specifically, the controller 4 controls the heating drive part 71 such that the stage 60 reaches the set temperature (target value). That is, the controller 4 controls the power supplied from the heating drive part 71 to the heater 63 such that the temperature detected by the temperature sensor 64 becomes the set temperature (target value). For example, the controller 4 controls the heating drive part 71 by proportional-integral-differential (PID) control.

<Abnormality Detection Method of Substrate Processing Apparatus 5>

Figure 4:
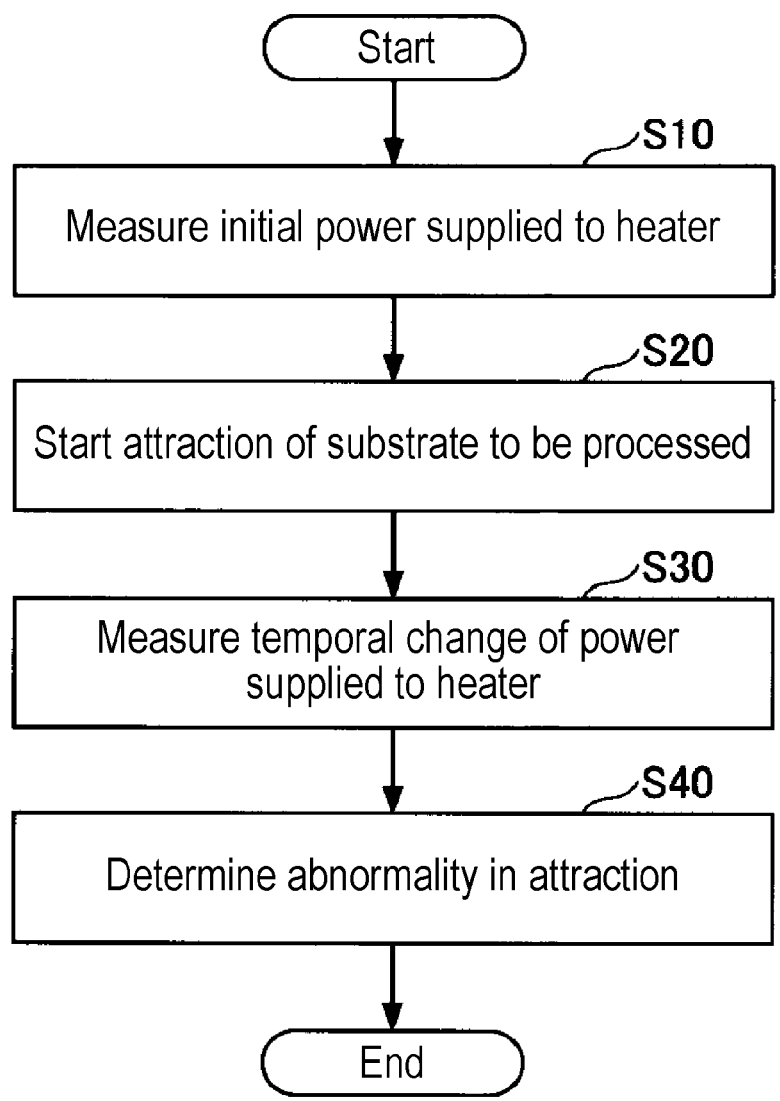
FIG. 4 is a flowchart illustrating an example of an abnormality detection method of the substrate processing apparatus of the semiconductor manufacturing apparatus according to the first embodiment.

An abnormality detection method performed by the controller 4 will be described. FIG. 4 is a flowchart showing an example of a method of detecting abnormality of the substrate processing apparatus 5, which is an example of the substrate processing apparatus of the semiconductor manufacturing apparatus according to the present embodiment.

First, a substrate W is placed on the electrostatic chuck 65 of the stage 60 by any of the transfer modules TM1, TM2, TM3, TM4, and TM5.

It is assumed that the substrate W is not electrostatically attracted by the electrostatic chuck 65 before the controller 4 starts the abnormality detection method.

The controller 4 measures initial power supplied to the heater 63 before the electrostatic chuck 65 attracts the substrate W (step S10). The initial power is power supplied from the heating drive part 71 in order to make the temperature of the stage 60 become a predetermined temperature.

The temperature of the stage 60 is controlled to be, for example, a set temperature (target value) of the substrate W in substrate processing. For example, when the set temperature (target value) of the substrate W in substrate processing is 350 degrees C., the controller controls the heating drive part 71 such that the temperature of the stage 60 becomes 350 degrees C. before the electrostatic chuck 65 attracts the substrate W.

As the initial power, a moving average of the power before a set time before the electrostatic chuck 65 attracts the substrate W may be measured, or an average of the power during a predetermined time period before the set time before the electrostatic chuck 65 attracts the substrate W may be measured. The set time may be determined, for example, by evaluation using an actual machine.

When the measurement of the initial power is completed, the controller 4 controls the DC power supply 72 and starts attraction of the substrate W (step S20).

The controller 4 starts attraction of the substrate W and at the same time starts measurement of a temporal change of the power supplied from the heating drive part 71 to the heater 63 (step S30).

Before the substrate processing is performed, the substrate W has a temperature substantially equal to a temperature of the transfer chamber 12. The temperature of the transfer chamber 12 is substantially room temperature (approximately 20 degrees C.). Therefore, the temperature of the substrate W is lower than the temperature of the stage 60.

When the electrostatic chuck 65 attracts the substrate W, heat is transferred from the electrostatic chuck 65 to the substrate W. Due to the heat transfer from the electrostatic chuck 65 to the substrate W, the temperature of the electrostatic chuck 65 decreases. When the temperature of the electrostatic chuck 65 decreases, the temperature of the base 62 also decreases. Since the controller 4 controls the temperature of the stage 60 to be constant, when the temperature of the base 62 decreases, the power supplied to the heater 63 from the heating drive part 71 is increased in order to increase the temperature of the stage 60.

Next, abnormality in attraction in the electrostatic chuck 65 is determined based on the temporal change of the power supplied to the heater 63 measured in step S30 (step S40).

Step S40 is an example of a step of detecting abnormality in attraction of the substrate W by the electrostatic chuck 65.

A heat transfer coefficient between the substrate W and the electrostatic chuck 65 varies depending on the attraction force by which the electrostatic chuck 65 attracts the substrate W. For example, when the electrostatic chuck 65 has strong attraction force for attracting the substrate W, the heat transfer coefficient between the substrate W and the electrostatic chuck 65 becomes high. On the other hand, when the electrostatic chuck 65 has weak attraction force for attracting the substrate W, the heat transfer coefficient between the substrate W and the electrostatic chuck 65 becomes low.

Therefore, when the electrostatic chuck 65 strongly attracts the substrate W, more heat is transferred from the electrostatic chuck 65 to the substrate W, and the temperature of the electrostatic chuck 65 changes significantly. Then, the power supplied from the heating drive part 71 to the heater 63 also changes significantly according to the change in the temperature of the electrostatic chuck 65.

On the other hand, when the electrostatic chuck 65 weakly attracts the substrate W, the heat transferred from the electrostatic chuck 65 to the substrate W is less compared to when the electrostatic chuck 65 strongly attracts the substrate W. Therefore, the change in temperature of the electrostatic chuck 65 is reduced compared to when the electrostatic chuck 65 strongly attracts the substrate W. In addition, the change in the power supplied from the heating drive part 71 to the heater 63 according to the change in the temperature of the electrostatic chuck 65 is reduced compared to when the electrostatic chuck 65 strongly attracts the substrate W.

Therefore, it is possible to detect abnormality in attraction in the electrostatic chuck 65 based on fluctuation of the power, which is supplied by the heating drive part 71, caused by the attraction of the substrate W by the electrostatic chuck 65. For example, if the fluctuation of the power supplied by the heating drive part 71 when the electrostatic chuck 65 attracts the substrate W is small, the controller 4 determines that it is abnormal. Further, it is possible to monitor whether or not the substrate W is attracted by the electrostatic chuck 65 with sufficient suction force.

<Evaluation Index of Power Fluctuation>

A method of calculating an evaluation index of fluctuation of power supplied by the heating drive part 71, which is generated by the attraction of the substrate W by the electrostatic chuck 65, will be described.

[Error Integration]

Figure 5:
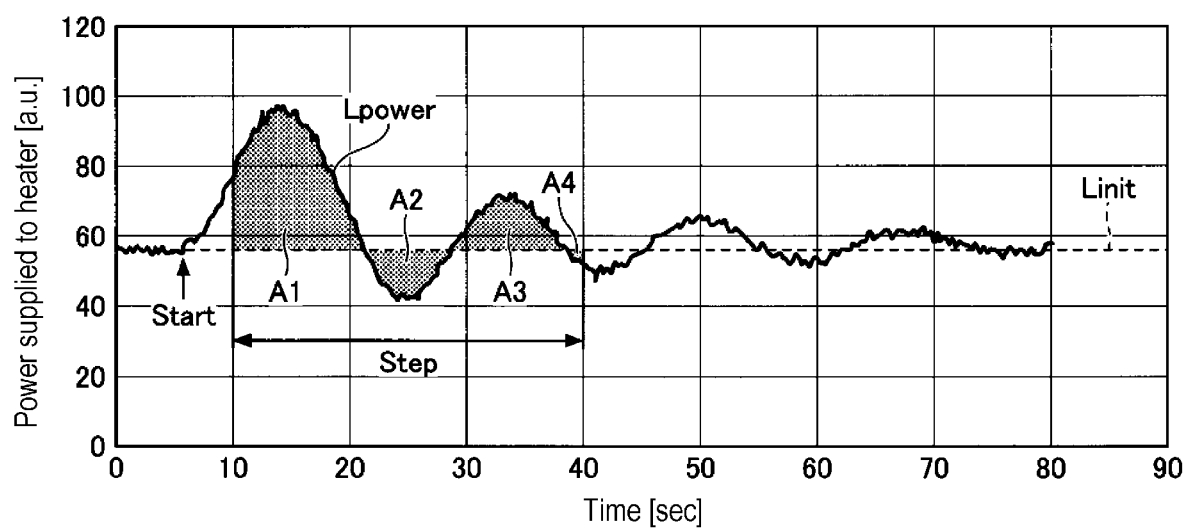
FIG. 5 is a view illustrating an example of the abnormality detection method of the substrate processing apparatus of the semiconductor manufacturing apparatus according to the first embodiment.
Figure 6:
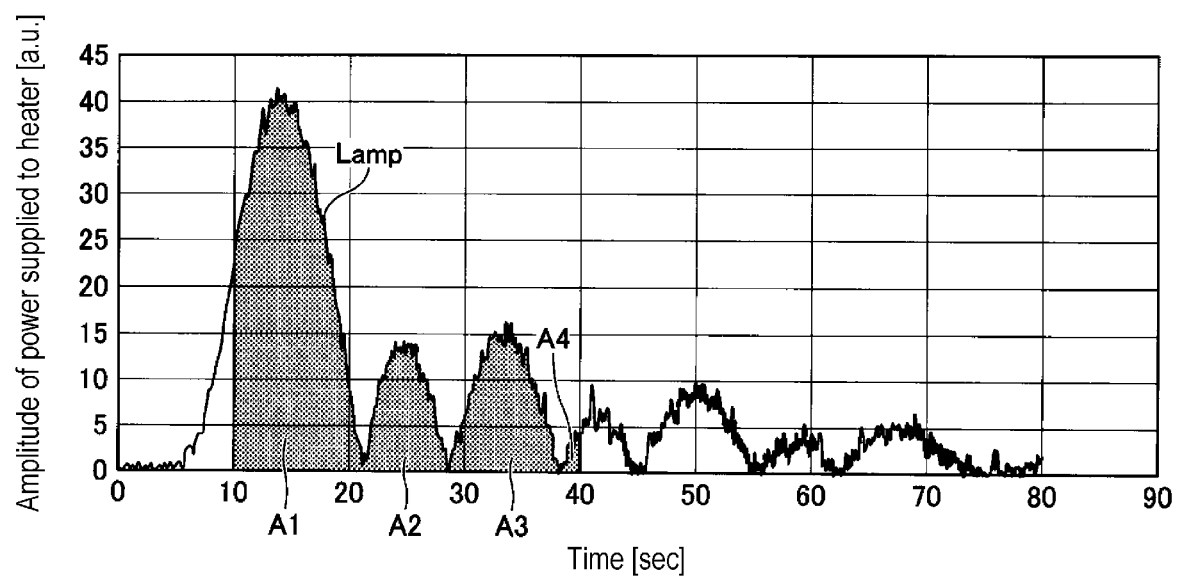
FIG. 6 is a view illustrating an example of the abnormality detection method of the substrate processing apparatus of the semiconductor manufacturing apparatus according to the first embodiment.

In order to calculate the fluctuation of the power supplied by the heating drive part 71, the controller 4 calculates, as an evaluation index, an integral value of the fluctuation of the power with respect to a certain reference value (a reference power value Wi). FIGS. 5 and 6 are diagrams illustrating error integration of a method of detecting abnormality of the substrate processing apparatus 5 of the semiconductor manufacturing apparatus according to the present embodiment.

In the error integration, an integral value of an absolute value of an error with respect to a certain reference value during a period of a processing step is calculated.

In FIGS. 5 and 6, a step of placing a substrate W is performed when time is at 5 seconds. For example, the substrate W is mounted on pins provided on the stage 60 by any of the transfer modules TM1, TM2, TM3, TM4, and TM5. Then, the pins are received inside the stage 60. By receiving the pins inside the stage 60, the substrate W is placed on the stage 60.

During the step of placing the substrate W, the power (reference power) supplied to the heater 63 is measured. The reference power is, for example, the initial power in step S10. For example, a line Linit in FIG. 5 represents the reference power value Wi. FIG. 6 shows an absolute value (amplitude) of an error between the measured power and the reference power value Wi.

Then, when time is at 5 seconds, the electrostatic chuck 65 starts attraction of the substrate W. When the electrostatic chuck 65 attracts the substrate W, heat is transferred from the electrostatic chuck 65 to the substrate W, and thus the temperature of the stage 60 including the electrostatic chuck 65 decreases. Then, in order to compensate for the decrease in the temperature of the stage 60, the power supplied from the heating drive part 71 to the heater 63 increases.

Then, a substrate processing is performed for 30 seconds from when time is at 10 seconds to 40 seconds (the period of "Step" in FIG. 5). The substrate processing is, for example, a process of depositing a material on the substrate W.

Integration of the absolute value of the error with respect to the reference power in the corresponding process is performed. An error integral value WS is obtained by Equation 1 assuming that a start time and an end time of the process are t1 (=10) seconds and t2 (=40) seconds, respectively, and a power value measured at time t is P(t).

$$WS = \int_{t1}^{t2} |P(t) - Wi| dt \qquad \text{[Equation 1]}$$

Specifically, a sum of areas A1, A2, A3, and A4 in FIGS. 5 and 6 is obtained.

Thereafter, the obtained error integral value WS is compared with a set threshold value Wth in a step. When the obtained error integral value WS is smaller than the set threshold value Wth, it is determined that the attraction in the electrostatic chuck 65 is not sufficient. That is, the controller 4 determines that the attraction of the substrate W by the electrostatic chuck 65 is abnormal.

When obtaining the error integral value WS, in a case that a substrate processing includes a plurality of steps, an absolute value of an error at each step with respect to the reference power may be accumulated from the first step. Then, the error integral value WS may be obtained from a difference from a previous step with respect to the accumulated value.

Figure 7:
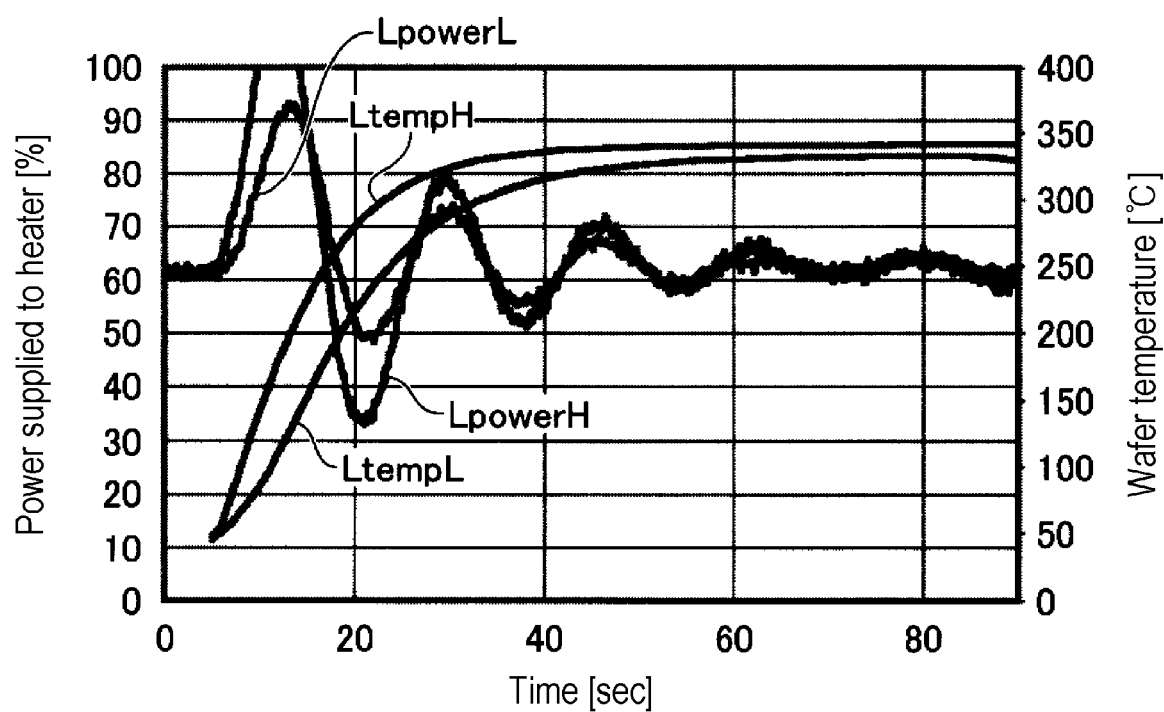
FIG. 7 is a view illustrating an example of the abnormality detection method of the substrate processing apparatus of the semiconductor manufacturing apparatus according to the first embodiment.

FIG. 7 is a diagram showing a power supplied to the heater 63 and a temperature change of a substrate W when a voltage supplied from the DC power supply 72 to the electrode 66 of the electrostatic chuck 65 is changed. Line LpowerH represents a power supplied from the heating drive part 71 to the heater 63 when a voltage of 350 volts was supplied from the DC power supply 72 to the electrode 66 of the electrostatic chuck 65.

Line LpowerL represents a power supplied from the heating drive part 71 to the heater 63 when a voltage of 175 volts was supplied from the DC power supply 72 to the electrode 66 of the electrostatic chuck 65. Line LtempH represents a temperature of the substrate W when a voltage of 350 volts was supplied from the DC power supply 72 to the electrode 66 of the electrostatic chuck 65. Line LtempL represents a temperature of the substrate W when a voltage of 175 volts was supplied from the DC power supply 72 to the electrode 66 of the electrostatic chuck 65.

The temperature of the substrate W was measured by attaching a thermocouple to a surface of the substrate W.

As shown in FIG. 7, fluctuation of the power supplied from the heating drive part 71 was greater when a voltage of 350 volts was supplied from the DC power supply 72 to the electrode 66 of the electrostatic chuck 65 compared to when a voltage of 175 volts was supplied to the electrode 66 of the electrostatic chuck 65. That is, the fluctuation of the power supplied from the heating drive part 71 was greater when the attraction force of the electrostatic chuck 65 was strong compared to when the attraction force of the electrostatic chuck 65 was weak.

In addition, as shown in FIG. 7, the temperature of the substrate W changed faster when a voltage of 350 volts was supplied from the DC power supply 72 to the electrode 66 of the electrostatic chuck 65 compared to when a voltage of 175 volts was supplied from the DC power supply 72 to the electrode 66 of the electrostatic chuck 65. That is, the temperature of the substrate W changed faster when the attraction force of the electrostatic chuck 65 was strong compared to when the attraction force of the electrostatic chuck 65 was weak.

Figure 8:
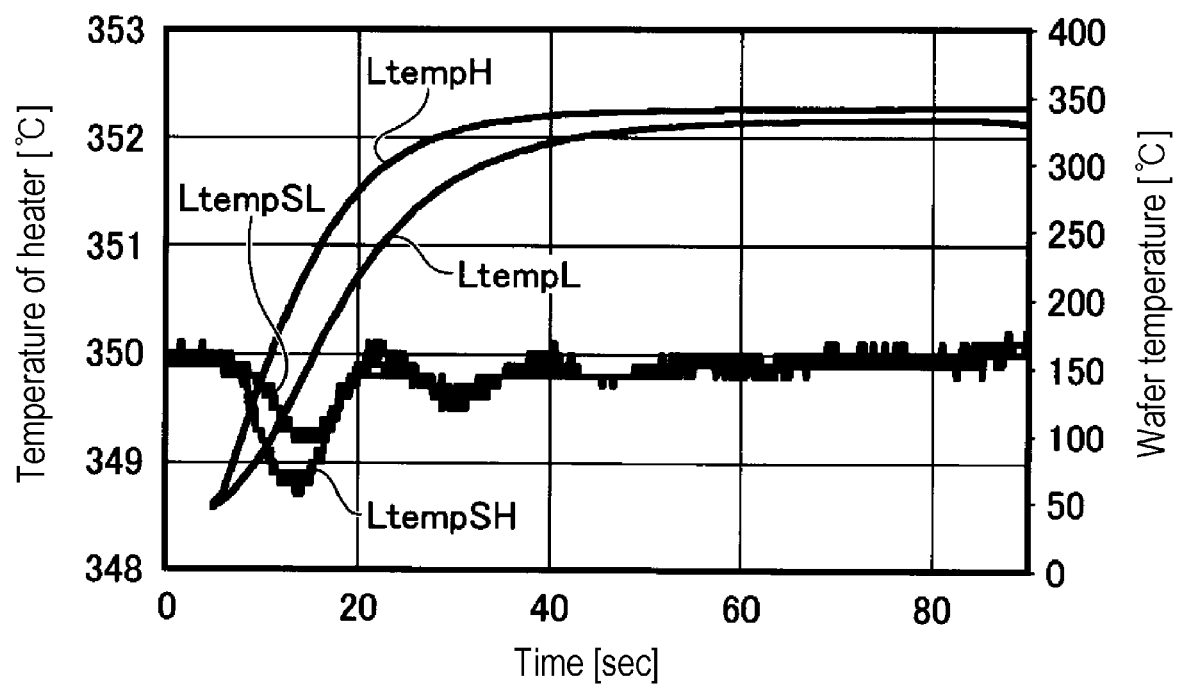
FIG. 8 is a view illustrating an example of the abnormality detection method of the substrate processing apparatus of the semiconductor manufacturing apparatus according to the first embodiment.

FIG. 8 is a diagram showing a temperature change of the stage 60 and a temperature change of a substrate W when the voltage supplied from the DC power supply 72 to the electrode 66 of the electrostatic chuck 65 varied. Line LtempSH represents a temperature of the stage 60 when a voltage of 350 volts was supplied from the DC power supply 72 to the electrode 66 of the electrostatic chuck 65. Line LtempSL represents a temperature of the stage 60 when a voltage of 175 volts was supplied from the DC power supply 72 to the electrode 66 of the electrostatic chuck 65. A temperature of the substrate W was the same as in FIG. 7.

As shown in FIG. 8, the temperature change of the stage 60 was greater when a voltage of 350 volts was supplied from the DC power supply 72 to the electrode 66 of the electrostatic chuck 65 compared to when a voltage of 175 volts was supplied from the DC power supply 72 to the electrode 66 of the electrostatic chuck 65. That is, the temperature change of the stage 60 was greater when the attraction force of the electrostatic chuck 65 was strong compared to when the attraction force of the electrostatic chuck 65 was weak.

From the above results, abnormality in attraction force of the electrostatic chuck 65 can be detected by measuring the power supplied to the heater 63. Further, it is possible to monitor whether or not the substrate W is attracted by the electrostatic chuck 65 with a sufficient attraction force.

The controller 4 is an example of a detector.

Figure 9:
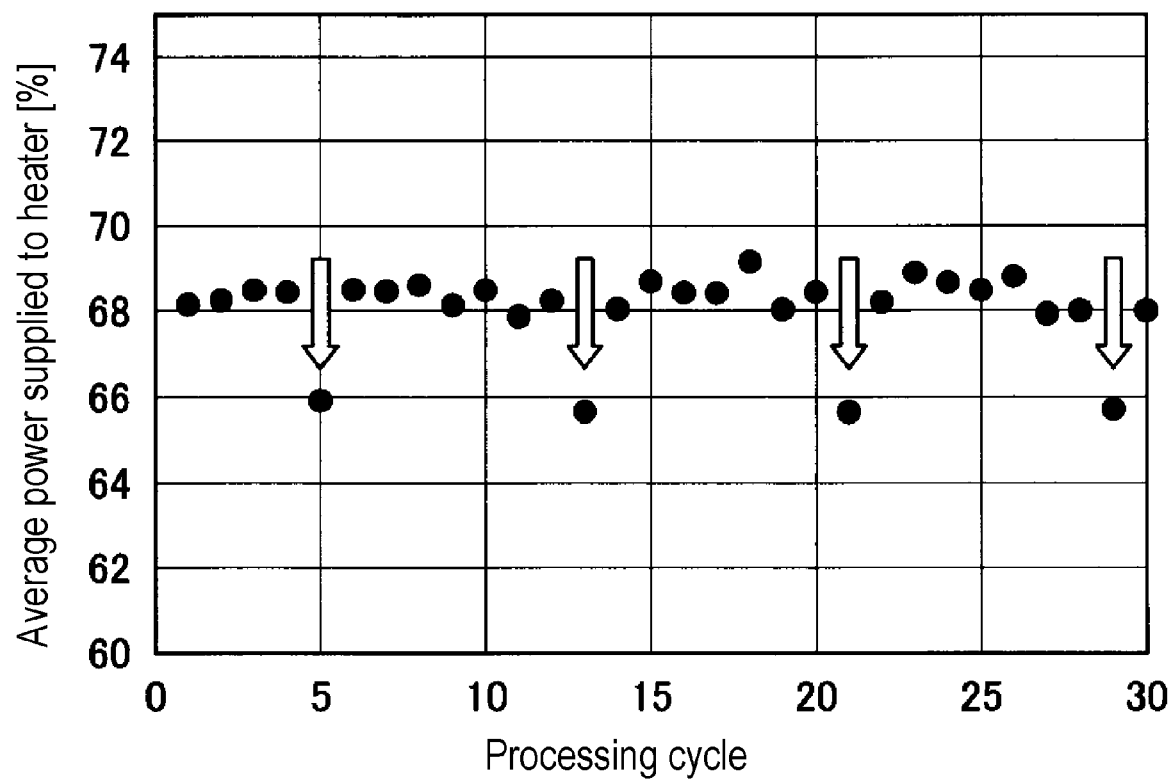
FIG. 9 is a view illustrating an example of the abnormality detection method of the substrate processing apparatus of the semiconductor manufacturing apparatus according to the first embodiment.

Next, a result of performing substrate processing a plurality of times, among which the substrate processing was performed several times with a reduced attraction force, will be described. FIG. 9 is a diagram illustrating a result of performing an abnormality detection method of the substrate processing apparatus 5, which is a substrate processing apparatus of the semiconductor manufacturing apparatus according to the present embodiment.

Here, the voltage supplied to the electrostatic chuck 65 in a normal processing cycle is 350 volts. In addition, in the 5$^{th}$, 13$^{th}$, 21$^{st}$, and 29$^{th}$ processing cycles, the voltage supplied to the electrostatic chuck 65 was set to 175 volts, and abnormality determination was performed.

As a result, as shown in FIG. 9, the error integral value became smaller in the 5$^{th}$, 13$^{th}$, 21$^{st}$, and 29$^{th}$ processing cycles. Further, by setting the set threshold value Wth to be, for example, 67%, abnormality can be detected correctly. In addition, it is possible to monitor whether or not the substrate W is attracted by the electrostatic chuck 65 with a sufficient attraction force.

Second Embodiment

<Evaluation Index of Power Fluctuation (Part 2)>

A second embodiment in which the evaluation index of power fluctuation is different from that of the first embodiment will be described. A method (part 2) of calculating an evaluation index of fluctuation of power supplied by the heating drive part 71, which is generated by attraction of the substrate W by the electrostatic chuck 65, will be described.

[Simple Integration]

Figure 10:
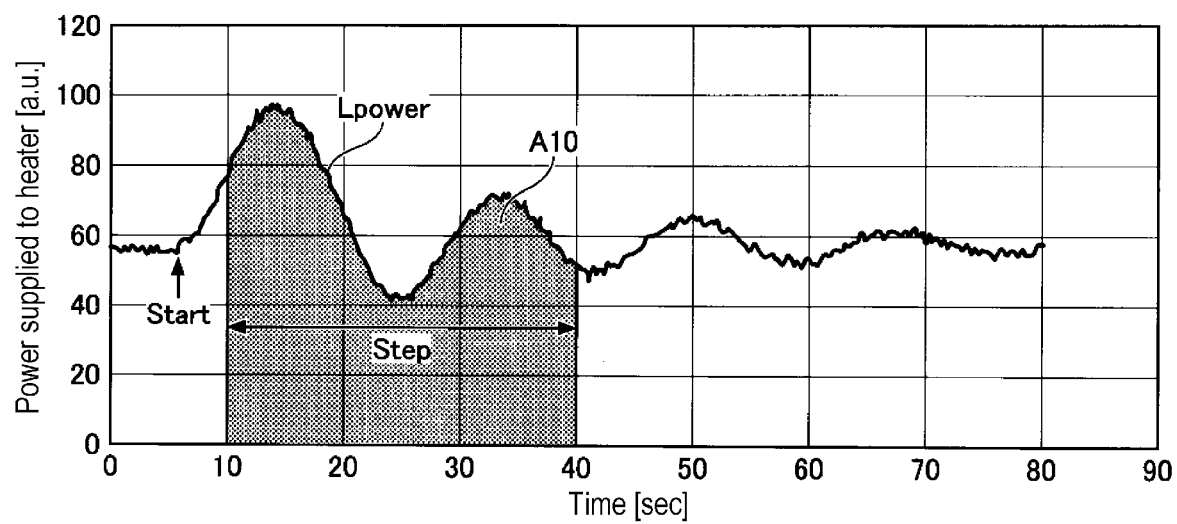
FIG. 10 is a view illustrating an example of an abnormality detection method of a substrate processing apparatus of a semiconductor manufacturing apparatus according to a second embodiment.

As shown in FIG. 10, the fluctuation is evaluated by using a simple integral value WD obtained by integrating power itself supplied to the heater 63 in the processing step "Step." A simple integral value WD is obtained based on Equation 2 assuming that initiating start time and an end time of the process are t1 (=10) second and t2 (=40) second, respectively, and a power value measured at time t is P(t).

$$WD = \int_{t1}^{t2} P(t)dt \qquad \text{[Equation 2]}$$

Specifically, an area A10 in FIG. 10 is obtained.

Even when the simple integral value WD obtained by the simple integration is used as an evaluation index, it is possible to monitor whether or not a substrate W is attracted by the electrostatic chuck 65 with sufficient attraction force.

In addition, the evaluation index of the power fluctuation is not limited to the above-described error integral value WS or simple integrated value WD. For example, a peak value, a maximum value, a maximum critical value, and the like of the power fluctuation may be used.

Third Embodiment

Regarding an evaluation index of fluctuation of the power supplied by the heating drive unit 71, which is generated by the attraction of the substrate W by the electrostatic chuck 65, a performance evaluation method of the evaluation index will be described.

Figure 11:
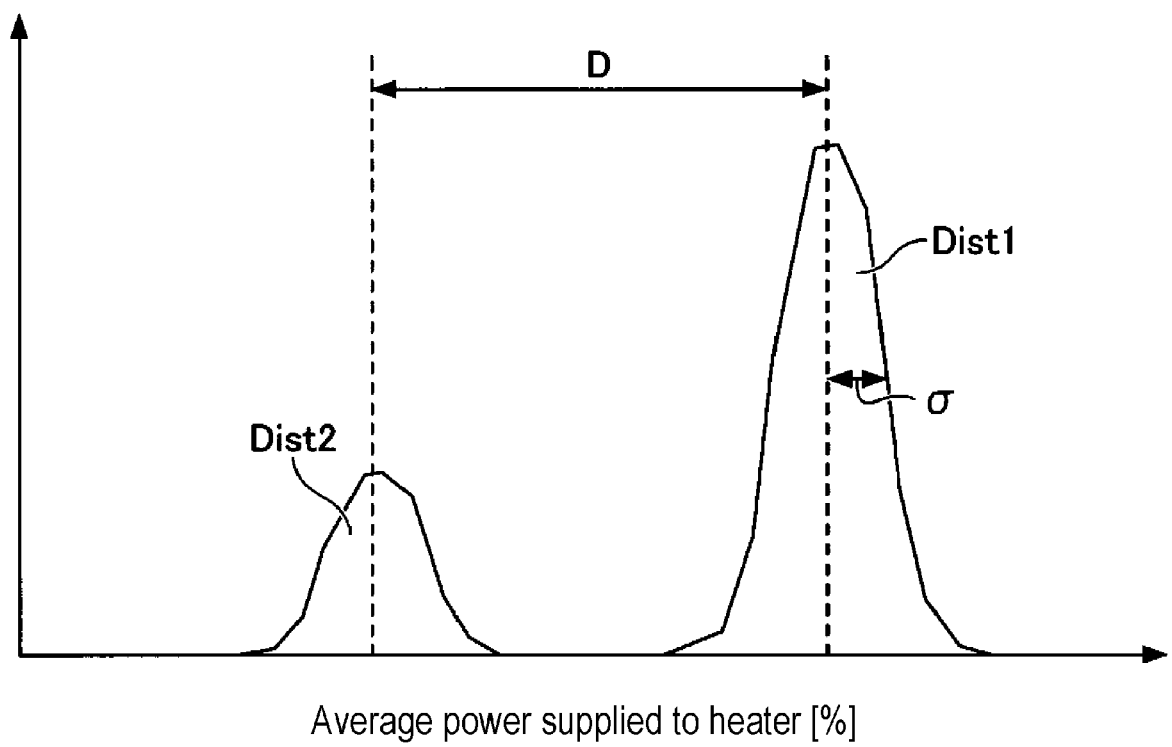
FIG. 11 is a view illustrating an example of a method of evaluating performance of an abnormality detection method of a substrate processing apparatus of a semiconductor manufacturing apparatus according to a third embodiment.

FIG. 11 shows a distribution of evaluation indices when performing a plurality of processing cycles which includes processing cycles with a reduced attraction force in the electrostatic chuck 65 as shown in FIG. 9.

Distribution Dist1 is a distribution of evaluation indices calculated a plurality of times when a voltage was supplied to generate a sufficient attraction force in the electrostatic chuck 65 (for example, when a voltage of 350 volts was supplied to the electrode 66 of the electrostatic chuck 65).

Distribution Dist2 is a distribution of evaluation indices calculated a plurality of times when a voltage of half the voltage generating the sufficient attraction force in the electrostatic chuck 65 (for example, when a voltage of 175 volts was supplied to the electrode 66 of the electrostatic chuck 65).

A standard deviation $\sigma$ is a standard deviation of the distribution Dist1. In addition, an average difference D is a difference between an average of the distribution Dist1 and an average of the distribution Dist2.

A value obtained by dividing the average difference D by the standard deviation $\sigma$ is called a performance evaluation value R. Performance evaluation of an evaluation index is performed based on the performance evaluation value.

<Comparison of Evaluation Indices>

When the error integral value WS was used, a performance evaluation value R1 was 8.2. On the other hand, when the simple integral value WD was used, a performance evaluation value R2 was 7.1. Therefore, the performance evaluation value becomes larger when the error integral value WS is used. Accordingly, it is more desirable to use the error integral value WS as an evaluation index.

Abnormality of the electrostatic chuck may be detected by using the performance evaluation value, for example, by obtaining performance evaluation values in a plurality of steps and using an evaluation index having a high performance evaluation value in each step. 350 volts is an example of a first voltage value, and 175 volts is an example of a second voltage value. The distribution Dist1 is an example of a first distribution, and the distribution Dist2 is an example of a second distribution.

According to the present disclosure, it is possible to monitor whether or not a substrate to be processed is attracted with a sufficient attraction force by the electrostatic chuck.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
    a stage including an electrostatic chuck configured to attract a substrate;
    a heater configured to heat the stage;
    a heating drive part configured to supply power to the heater so that a temperature of the stage becomes a target value; and
    a detector configured to detect an abnormality in attraction of the substrate by the electrostatic chuck,
    wherein the detector is further configured to detect the abnormality based on fluctuation of the power supplied to the heater, the fluctuation being generated by the attraction of the substrate by the electrostatic chuck, and
    wherein when detecting the abnormality, the detector is further configured to:
        calculate an evaluation index for evaluating the fluctuation,
        calculate a first distribution of the evaluation index by applying a voltage having a first voltage value to the electrostatic chuck to attract the substrate by the electrostatic chuck and calculating the evaluation index a plurality of times,
        calculate a second distribution of the evaluation index by applying a voltage having a second voltage value smaller than the first voltage value to the electrostatic chuck to attract the substrate by the electrostatic chuck and calculating the evaluation index a plurality of times, and
        calculate a performance evaluation value based on the first distribution and the second distribution.

2. A method of detecting abnormality of a substrate processing apparatus, which includes a stage including an electrostatic chuck configured to attract a substrate, a heater configured to heat the stage, and a heating drive part configured to supply power to the heater so that a temperature of the stage becomes a target value, the method comprising:
    detecting an abnormality in attraction of the substrate by the electrostatic chuck based on fluctuation of the power supplied to the heater, the fluctuation being generated by the attraction of the substrate by the electrostatic chuck,
    wherein the detecting the abnormality further comprises:
        calculating an evaluation index for evaluating the fluctuation,
        calculating a first distribution of the evaluation index by applying a voltage having a first voltage value to the electrostatic chuck to attract the substrate by the electrostatic chuck and calculating the evaluation index a plurality of times,
        calculating a second distribution of the evaluation index by applying a voltage having a second voltage value smaller than the first voltage value to the electrostatic chuck to attract the substrate by the electrostatic chuck and calculating the evaluation index a plurality of times, and
        calculating a performance evaluation value based on the first distribution and the second distribution.

3. The method of claim 2, wherein the performance evaluation value is a value obtained by dividing a difference between an average of the first distribution and an average of the second distribution by a standard deviation of the first distribution.

* * * * *